US012686350B2

(12) United States Patent
Maaser et al.

(10) Patent No.: US 12,686,350 B2
(45) Date of Patent: Jul. 21, 2026

(54) DEVICE AND METHOD FOR ESTABLISHING AN ELECTRICAL CONNECTION BETWEEN AN ELECTRICAL TRACTION ENERGY STORE AND A HIGH-VOLTAGE VEHICLE ELECTRICAL SYSTEM FOR A MOTOR VEHICLE

(71) Applicant: MAN Truck & Bus SE, Munich (DE)

(72) Inventors: Christoph Maaser, Munich (DE); Jürgen Herzig, Munich (DE); Bernd Milkau, Munich (DE); Michael Klauke, Munich (DE)

(73) Assignee: MAN Truck & Bus SE, Munich (DE)

( * ) Notice: Subject to any disclaimer, the term of this patent is extended or adjusted under 35 U.S.C. 154(b) by 177 days.

(21) Appl. No.: 18/683,225

(22) PCT Filed: Jul. 27, 2022

(86) PCT No.: PCT/EP2022/071089
§ 371 (c)(1),
(2) Date: Mar. 24, 2025

(87) PCT Pub. No.: WO2023/016810
PCT Pub. Date: Feb. 16, 2023

(65) Prior Publication Data
US 2025/0381925 A1     Dec. 18, 2025

(30) Foreign Application Priority Data

Aug. 12, 2021 (DE) .......................... 102021120980.3

(51) Int. Cl.
| | |
|---|---|
| *B60R 16/033* | (2006.01) |
| *B60L 50/60* | (2019.01) |
(Continued)

(52) U.S. Cl.
CPC ............ *B60R 16/033* (2013.01); *B60L 50/60* (2019.02); *H05K 5/0221* (2013.01); *H05K 5/0247* (2013.01); *H05K 5/13* (2025.01)

(58) Field of Classification Search
CPC ......... B60R 16/033; B60L 50/60; H05K 5/13; H05K 5/0221; H05K 5/0247; H05K 5/02
See application file for complete search history.

(56) References Cited

U.S. PATENT DOCUMENTS 7,817,435 B2    10/2010  Iwaasa

FOREIGN PATENT DOCUMENTS

| | | |
|---|---|---|
| DE | 102011004625 A1 | 8/2012 |
| DE | 102013204673 A1 | 9/2014 |
(Continued)

OTHER PUBLICATIONS

German Search Report corresponding to German Patent Application No. 10 2021 120 980.3, dated Apr. 25, 2022. (5 Pages).
(Continued)

*Primary Examiner* — Robert L Deberadinis
(74) *Attorney, Agent, or Firm* — Maginot, Moore & Beck LLP

(57) ABSTRACT

A device and a method establish an electrical connection between an electrical traction energy storage system and a high-voltage on-board electrical system for a motor vehicle. The device includes a housing, and a battery junction box assembly connected or connectable to the housing using a first detachable connection. The battery junction box assembly includes a switching device and a touch protection cover. The switching device is arranged on a carrier plate and selectively establishes or disconnects an electrical connection between a first terminal for connecting the electrical traction energy storage system and a second terminal for connecting the high-voltage on-board electrical system. The
(Continued)

touch protection cover is configured as a cover for the switching device and is connected or may be connected to the carrier plate using a second detachable connection. The second detachable connection is arranged such that it is not accessible in an assembled state of the device.

18 Claims, 4 Drawing Sheets

(51) Int. Cl.
  *H05K 5/02*          (2006.01)
  *H05K 5/13*          (2025.01)

(56)          References Cited

FOREIGN PATENT DOCUMENTS

| | | | |
|---|---|---|---|
| DE | 102014002819 | A1 | 8/2015 |
| KR | 101131735 | B1 | 4/2012 |
| KR | 101529067 | B1 | 6/2015 |
| WO | 2013011626 | A1 | 1/2013 |

OTHER PUBLICATIONS

International Search Report and Written Opinion corresponding to International Application No. PCT/EP2022/071089, dated Nov. 30, 2022. (15 Pages).

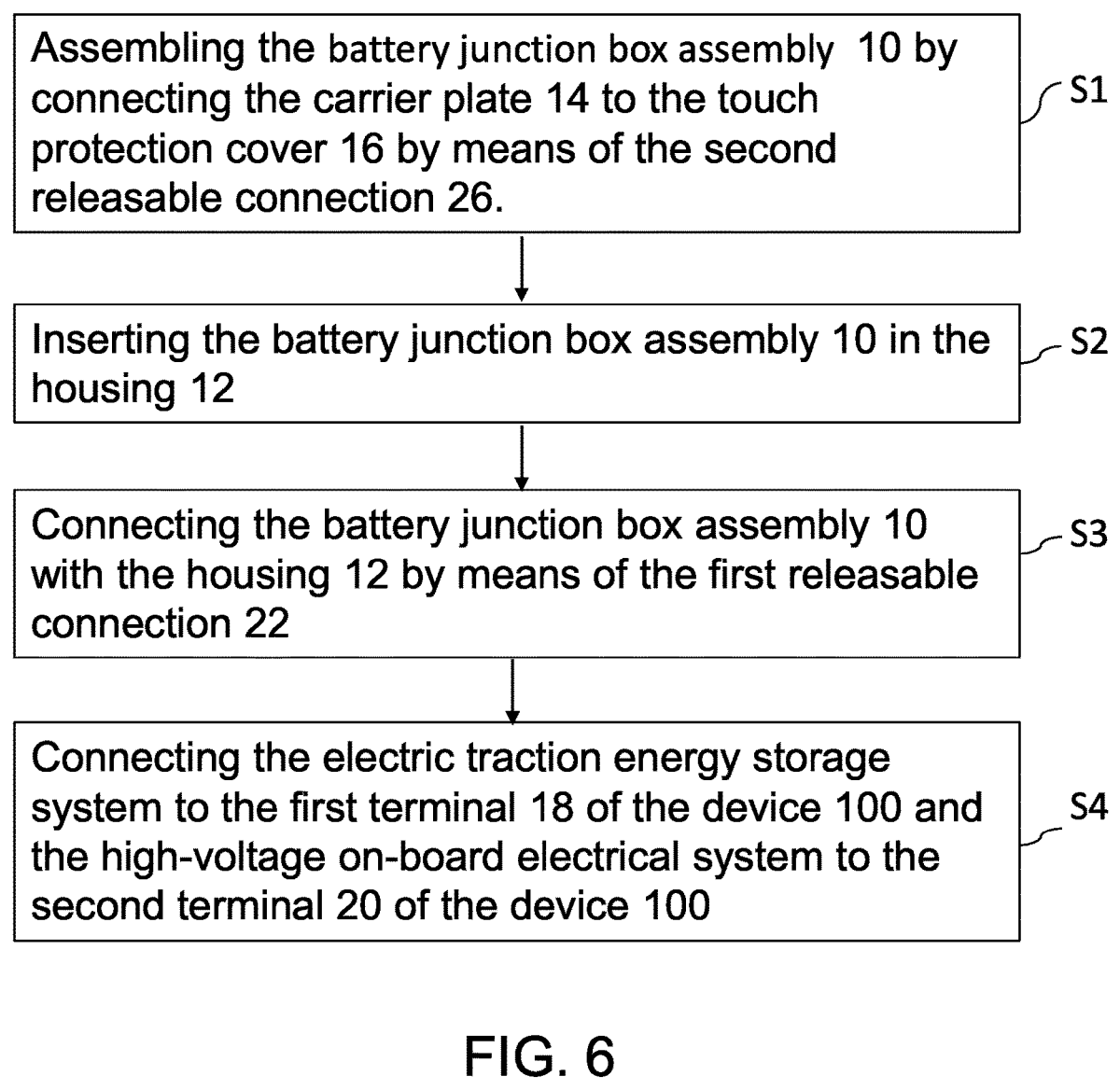

Assembling the battery junction box assembly 10 by connecting the carrier plate 14 to the touch protection cover 16 by means of the second releasable connection 26.        S1

Inserting the battery junction box assembly 10 in the housing 12        S2

Connecting the battery junction box assembly 10 with the housing 12 by means of the first releasable connection 22        S3

Connecting the electric traction energy storage system to the first terminal 18 of the device 100 and the high-voltage on-board electrical system to the second terminal 20 of the device 100        S4

FIG. 6

DEVICE AND METHOD FOR ESTABLISHING AN ELECTRICAL CONNECTION BETWEEN AN ELECTRICAL TRACTION ENERGY STORE AND A HIGH-VOLTAGE VEHICLE ELECTRICAL SYSTEM FOR A MOTOR VEHICLE

The present application is the U.S. national phase of PCT Application PCT/2022/071089, filed on Jul. 27, 2022, which claims priority of German patent application no. 10 2021 120 980.3, filed Aug. 12, 2021, which is incorporated herein by reference in its entirety.

TECHNICAL FIELD

The disclosure relates to a device and a method for establishing an electrical connection between an electrical traction energy storage system and a high-voltage on-board electrical system for a motor vehicle, and to a motor vehicle comprising the device.

BACKGROUND

Hybrid, plug-in hybrid, fuel cell and electric vehicles have a traction energy storage system that is used to absorb or provide recuperation and drive energy. Traction energy storage systems may be based on accumulators, e.g. Li-ion batteries, or so-called supercapacitors, or contain a combination of such storage types. Typically, such traction energy storage systems have a modular structure, whereby individual energy storage cells are electrically combined to form individual modules, which in turn are connected in series and/or parallel.

It is also known in practice to provide a battery junction box for traction energy storage systems. The battery junction box for high-voltage (HV) traction energy storage systems consists of disconnecting elements and fuses to selectively disconnect and connect the live part of the traction energy storage system from the high-voltage (HV) vehicle electrical system. Such devices, known as battery junction boxes or battery junction box assembly, ensure that no dangerous voltage is applied to the parts that are at risk of contact, such as externally accessible contacts, etc.

A disadvantage of the battery junction boxes known from the state of the art is the potential for hazards during assembly or disassembly due to areas that are not protected against contact. For example, battery junction boxes comprising a touch protection plastic component as a cover are known from the prior art. Several interfaces of the battery junction box are configured on such a plastic component, which are connected to terminals (connectors) to the traction energy storage system via busbars. It should be noted that the touch protection is ensured by additional plastic components that cover the busbars and the interfaces.

To dismantle such a battery junction box, all connectors between the interfaces must be disconnected. However, this means that when a connector is disconnected, e.g. by dismantling a busbar, a face that is not protected against contact, namely the free interface of the battery junction box, is present, but voltage is still present at the battery junction box. This creates a potential hazard.

It is therefore an objective of the disclosure to provide an improved technique for establishing an electrical connection between an electrical traction energy storage system and a high-voltage on-board electrical system for a motor vehicle, which avoids the disadvantages of known approaches. In particular, the task is to provide a device with a battery junction box assembly that enables permanent contact-protected assembly and disassembly of the battery junction box assembly.

SUMMARY

The objective is solved by the features of the independent claims. Advantageous further embodiments are specified in the dependent claims and the description.

According to a first general aspect, there is provided a device for establishing an electrical connection between an electrical traction energy storage system and an electrically powered motor vehicle electrical system. The device comprises a housing, preferably made of metal, particularly preferably aluminum, and a battery junction box assembly, which is connected or connectable to the housing by means of a first detachable connection. The connector of the battery junction box assembly to the housing may take place after insertion of the battery junction box assembly into the housing (i.e. accommodating the battery junction box assembly within the housing).

The battery junction box assembly comprises a switching device, which is arranged on a carrier plate and is configured to selectively establish or disconnect an electrical connection between a first terminal for connecting the electrical traction energy storage system and a second terminal for connecting the high-voltage on-board electrical system. The battery junction box assembly also comprises a touch protection cover, preferably made of plastic, which is configured as a cover for the switching device and is connected or may be connected to the carrier plate by means of a second detachable connection. The second detachable connection is preferably arranged in such a way that it is not accessible in an assembled state of the device. An assembled state of the device is present when the touch protection cover is connected to the carrier plate by means of the second detachable connection (i.e. the battery junction box assembly is assembled) and the (assembled) battery junction box assembly is connected to the housing by means of the first detachable connection. The second detachable connection is not accessible if it cannot be detached manually or with conventional tools.

Advantageously, the device is configured in such a way that the battery junction box assembly is permanently protected against contact during assembly, disassembly and in the assembled state. A so-called box-in-box system is provided, whereby the battery junction box assembly (inner box of the box-in-box system) is arranged inside the housing (outer box of the box-in-box system) in the assembled state. Due to its arrangement, the second detachable connection cannot be loosened and thus the touch protection cover cannot be removed as long as the battery junction box assembly is inserted in the housing and the two connections of the battery junction box assembly are electrically connected to the electric traction energy storage system or the high-voltage on-board electrical system. The touch protection cover may therefore not be removed or bypassed before the device has been de-energised and the battery junction box assembly has been removed from the housing.

The arrangement of the second detachable connection in such a way that it is not accessible when the device is mounted (assembled) means that the second detachable connection is only accessible to a user when the battery junction box assembly is not inserted in the housing. Protection against direct contact in accordance with the specified IP (International Protection) protection classes, e.g. IPXXB, is always guaranteed by this "fail-safe system", as the battery junction box assembly is permanently protected against contact and is therefore safe to install and remove.

The housing may be configured exclusively to accommodate the battery junction box assembly and, if necessary, the electrical connection cables. The housing may be configured to be box-shaped and/or open on one side. An open side of the housing may be closed, for example, by means of a fastenable (screwable) cover. The touch protection cover may be configured to be box-shaped and/or open on one side, at least in sections. The touch protection cover and the carrier plate, e.g. projections configured on the carrier plate, may be configured to engage with each other in a form-fit manner, at least in sections. The carrier plate is preferably made of plastic.

According to a particularly preferred embodiment, the second detachable connection may be arranged in the mounted state of the device in the portion of a gap between an outer face of the touch protection cover and an inner face of the housing and/or on a side of the carrier plate facing away from the touch protection cover. The gap may comprise a width of less than 2 cm, preferably less than 1 cm, or be configured in such a way that the second detachable connection lies against the inner surface of the housing.

Advantageously, the second detachable connection is not accessible in the assembled state. A user cannot release the second detachable connection manually, i.e. with his fingers, or with conventional tools when the device is mounted, and thus cannot remove the touch protection cover in this state, which ensures permanent protection. This means, for example, that the device is protected against contact at all times during disassembly, as the second detachable connection prevents the touch protection cover from being pulled off and it is also not possible to loosen the second detachable connection as the distance between the housing and the touch protection cover is too small.

The second releasable connection may comprise one or more connectors of different connection types. According to a further preferred embodiment, the second detachable connection may comprise at least one clip, snap, screw and/or latch connection. In addition to the second releasable connection, at least one further releasable connection may also be provided for connecting the touch protection cover to the carrier plate. The second detachable connection and the at least one further detachable connection may comprise connections of the same connection type.

It has been established above that the housing and the battery junction box assembly are connected or may be connected by means of a first detachable connection. According to a further preferred embodiment, the first detachable connection may comprise at least one screw that is inserted into the touch protection cover in a captive (secure) manner. The at least one screw may in each case be inserted in a bushing that is integrated in the touch protection cover. The at least one screw and/or the respective bushing may be injection-moulded components and/or made of plastic. The respective bushing may be configured in such a way that the at least one screw cannot be removed from the bushing. The at least one screw may be specially (exclusively) configured to connect the battery junction box assembly to the housing.

Advantageously, it may be ruled out that the battery junction box assembly is connected to the housing if the touch protection cover is forgotten or not arranged. The device may be advantageously configured in such a way that the battery junction box assembly cannot be fastened in the housing with "foreign" screws.

According to a further embodiment, the first terminal may comprise a plurality of electrical cables, each of which passes through one of a plurality of openings formed by the touch protection cover and/or the carrier plate and is connected (mechanically and electrically) to the switching device. The openings thus serve as cable passages. One end of each electrical cable may be connected directly to the switching device, preferably a contactor of the switching device, e.g. by means of a screw connection. The first terminal may be configured with two poles and comprise two, preferably four or more, electrical lines (cables). For example, two electrical lines (cables) may be provided for connection to a positive pole of the electrical traction energy storage system and two electrical lines (cables) for connection to a negative pole of the electrical traction energy storage system.

In contrast to the prior art, the battery junction box assembly advantageously comprises no additional detachable electrical connection interfaces arranged on the outside, e.g. on the touch protection cover, which must each be electrically connected to the first terminal, e.g. by means of a busbar. Accordingly, when dismantling the battery junction box assembly, no connectors of such interfaces need to be disconnected, which would expose electrical contacts. Instead, the cables are routed through the openings (openings) into the interior of the battery junction box assembly and screwed into place there. This means that there is no potential hazard because no live components are exposed and energised during assembly or disassembly. Furthermore, there are no additional assembly steps or additional components, e.g. cables or busbars.

According to a further embodiment, at least one of the plurality of openings may comprise an adjacent holder for one of the plurality of electrical cables, which in the mounted state of the device is positively formed by the touch protection cover and the carrier plate. The holder may be configured and arranged relative to the respective opening in such a way that the cable emerging from the respective opening comprises a U-shaped, arc-shaped, wave-shaped, S-shaped, meandering and/or labyrinthine course in this portion.

Advantageously, each of the multiple cables may be led out of the battery junction box assembly and held in a fixed position.

According to a further embodiment, the multiple electrical cables may each comprise an insulated (high-voltage) connector and may be fed through or passed through openings in the housing. The lengths of the multiple electrical cables may be dimensioned such that, when the device is mounted, each of the apertures is occupied by one of the multiple electrical cables. The lengths of the plurality of electrical cables may also be dimensioned such that, when the device is mounted, each of the insulated plug connectors is arranged (completely) outside the housing.

Advantageously, a simple electrical connection may be provided for the device with the electric traction energy storage system and thus simple installation in a motor vehicle. By appropriately selecting the lengths of the multiple electrical cables, it may be ensured that the electrical plug connections with the electrical traction energy storage system may only be made when the device is in the assembled state. The lengths of the electrical cables may also be arranged in such a way that when the battery junction box assembly is removed from the housing, the electrical cables would preferably stretch after a short time and the electrical cables would also have to be disconnected at the plug connectors in order to remove the battery junction box assembly completely. This ensures that the supply voltage is automatically disconnected during removal.

Another advantage is that the battery junction box assembly may only be removed from the housing once the electrical plug connections have been disconnected or the electrical plug connections are automatically disconnected when the battery junction box assembly is removed, because it would otherwise not be possible to remove the battery junction box assembly due to the cable lengths. Due to the selected lengths of the multiple electrical cables and optionally the holders configured in the battery junction box assembly, it may thus be ensured that the electrical connectors to the traction energy storage system are released by the respective tensile force on the multiple cables when the battery junction box assembly is removed, for example.

According to a further embodiment, the second terminal may comprise a (high-voltage) plug-in unit configured in the housing and at least one electrical line, preferably at least one busbar, for establishing an electrical connection between the plug-in unit and the switching device. The at least one electrical line may be covered by the touch protection cover when the device is mounted. The second terminal may be configured with two poles and/or comprise two or more electrical lines.

Advantageously, the device may be easily electrically connected to the high-voltage on-board electrical system and thus easily installed in a motor vehicle. At the same time, it is ensured that the second terminal is also permanently protected against accidental contact.

According to a further embodiment, at least one contact screw, with which the at least one electrical cable is screwed or may be screwed to a contact of the plug-in unit, may be held in a captive manner in a receiving opening of the at least one electrical cable or in a receiving opening for the at least one electrical cable by the touch protection cover. For each of the at least one contact screw, the captive device formed in the touch protection cover may comprise an opening, which may be configured, for example, in the shape of a dome or as an elongated opening, through which the respective contact screw may be screwed by means of a tool. The at least one contact screw may be made of plastic.

Advantageously, the second terminal may only be electrically connected to the switching device once the touch protection cover has been fitted and the battery junction box assembly has been inserted into the housing. In addition, the battery junction box assembly may only be removed from the housing once the electrical contact between the plug-in unit and the electrical cable has been disconnected by loosening the at least one contact screw. The touch protection cover requirements are guaranteed with this design.

According to a further embodiment, a control unit for the, preferably automated, control of the switching device may also be arranged on the carrier plate, preferably with the control unit being arranged outside the touch protection cover when the device is mounted. The switching device may comprise a sensor system for measuring a current conducted through the switching device (a current intensity and/or a current voltage) and at least one disconnecting element, preferably at least one contactor, for controllably establishing or disconnecting the electrical connection between the first terminal and the second terminal. The contactors may be the main contactors of the traction energy storage system. The switching device may further comprise at least one fuse, preferably at least one fuse and/or a semiconductor protection element. The control unit may also be configured to control the at least one disconnecting element as a function of the measurement. The control unit may be pre-programmed. The control unit may comprise predetermined conditions at which the electrical connection between the first terminal and the second terminal is to be established and/or disconnected, as measured by the sensor system. The predetermined conditions may be stored in a memory of the control unit.

According to a second general aspect, there is provided a method of assembling a device for establishing an electrical connection between an electrical traction energy storage system and a high-voltage on-board electrical system of a motor vehicle, preferably the device as disclosed herein. The method comprises assembling a battery junction box assembly by connecting a carrier plate to a touch protection cover, which is configured as a cover for a switching device arranged on the carrier plate, by means of a second detachable connection. The second detachable connection is preferably arranged such that it is not accessible in an assembled state of the device. The method further comprises inserting the (assembled) battery junction box assembly into a housing and connecting the (assembled) battery junction box assembly to the housing by means of a first releasable connection. The method further comprises connecting the electrical traction energy storage system to a first terminal of the device and the high-voltage on-board power supply to a second terminal of the device, preferably after assembling the battery junction box assembly and after connecting the battery junction box assembly to the housing.

The device is advantageously configured in such a way that assembly is only possible in this sequence of process steps and thus the battery junction box assembly is permanently protected against contact. In particular, the electrical connectors with the electrical traction energy storage system and the high-voltage on-board electrical system of the motor vehicle are only established when the device is already in the assembled state.

In order to avoid repetition, features previously disclosed purely according to the device should also be regarded as disclosed according to the process and be claimable.

According to a further general aspect, there is provided a method of disassembling a device for establishing an electrical connection between an electrical traction energy storage system and a high-voltage electrical system of a motor vehicle, preferably the device as disclosed herein. The method comprises disconnecting the electrical traction energy storage system from a first terminal of the device and the high-voltage electrical system from a second terminal of the device. The method further comprises disconnecting a first detachable connection connecting a battery junction box assembly to a housing, and removing the battery junction box assembly from the housing. The method further comprises disassembling the removed battery junction box assembly by releasing a second releasable connection, which connects a carrier plate to a touch protection cover, which is configured as a cover for a switching device arranged on the carrier plate. The second detachable connection is preferably arranged such that it is not accessible in an assembled state of the device.

Advantageously, the device is configured in such a way that disassembly is only possible in this sequence of process steps and thus the battery junction box assembly is permanently protected against contact. In particular, the electrical connectors with the electrical traction energy storage system and the high-voltage on-board electrical system of the motor vehicle are disconnected at the beginning or must be disconnected before the actual disassembly of the device takes place or before the actual disassembly may take place.

According to a further general aspect, there is provided an (electrically powered) motor vehicle comprising a device as disclosed herein. An electrical traction energy storage system is connected to the first terminal of the device and a high-voltage on-board electrical system is connected to the second terminal of the device. The device may be (directly) fastened to the traction energy storage device. The traction energy storage device may comprise counterparts for insulated connectors of the plurality of cables of the first terminal.

The embodiments, variants and features described above may be combined with one another as desired. Further details and advantages of the disclosure are described below with reference to the accompanying drawings.

BRIEF DESCRIPTION OF THE DRAWINGS

FIG. 6 shows a schematic representation of a process according to one embodiment.

DETAILED DESCRIPTION

For simplified understanding, the orientation of the device 100 or battery junction box assembly 10 according to the invention is indicated in FIGS. 1 to 5 by means of an exemplary Cartesian coordinate system, wherein, for example, the x-direction corresponds to a length direction, the y-direction corresponds to a width direction and the z-direction corresponds to a height direction of the device 100 in an assembled state.

Figure 1:
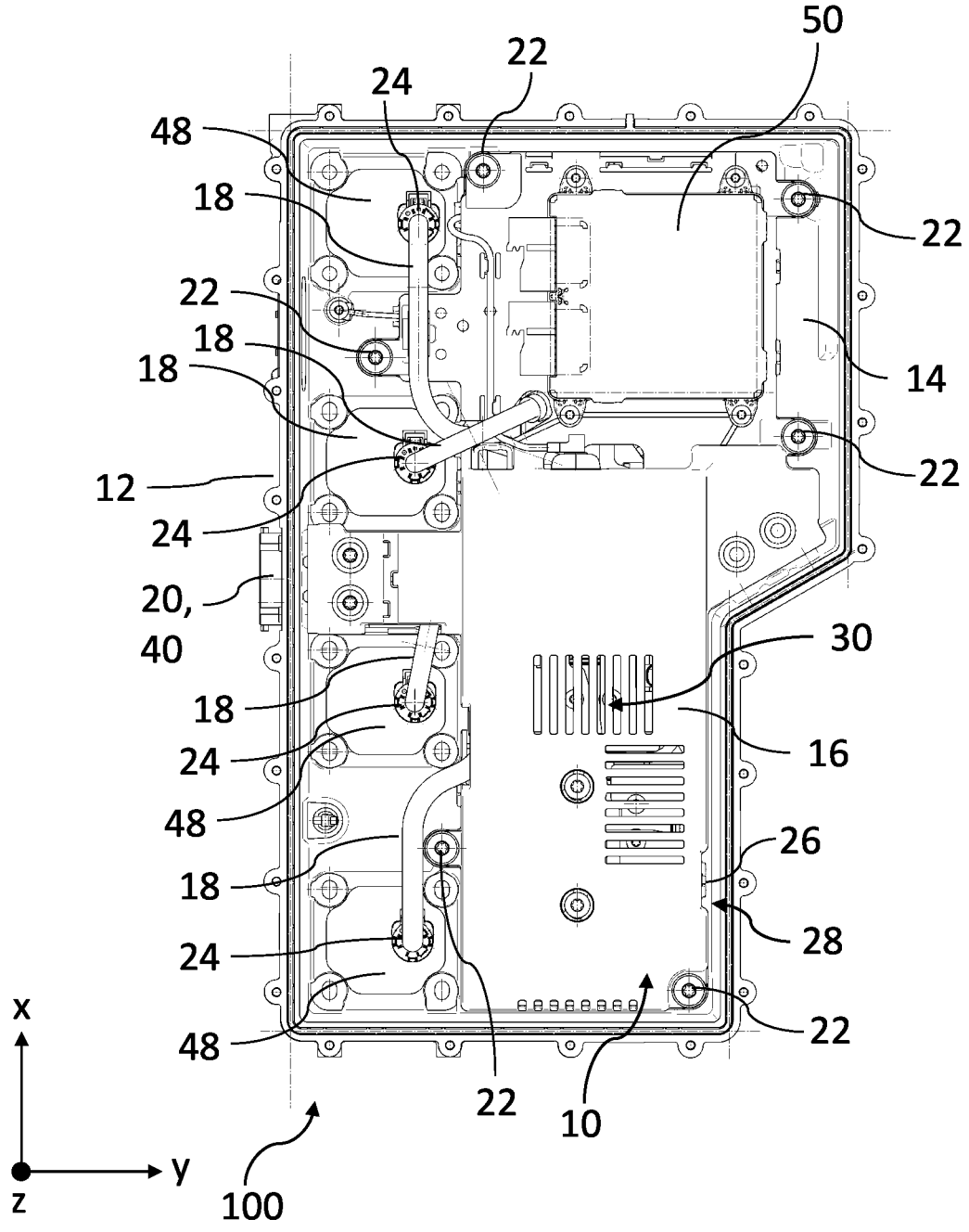
FIG. 1 shows a schematic top view of a device according to one embodiment.

FIG. 1 shows a schematic top view of the device 100 for establishing an electrical connection between an electrical traction energy storage system and a high-voltage on-board electrical system for a motor vehicle. The device 100 is shown here in an assembled state.

The device 100 comprises a housing 12 and a battery junction box assembly 10, which in turn comprises a switching device 30, a carrier plate 14 and a touch protection cover 16.

In the assembled state of the device 100 shown in FIG. 1, the battery junction box assembly 10 is inserted into the housing 12 and connected to the housing 12 by means of a first detachable connection 22. The first detachable connection 22 may comprise one or more screws 22, which are captive in the touch protection cover 16.

The switching device 30 is arranged on the carrier plate 14 and is configured to selectively establish or disconnect an electrical connection between a first terminal 18 for connecting the electric traction energy storage system and a second terminal 20 for connecting the high-voltage on-board electrical system.

The touch protection cover 16 is configured as a cover for the switching device 30 and is connected or may be connected to the carrier plate 14 by means of a second detachable connection 26. The touch protection cover 16 is made of a non-conductive material, preferably a plastic. In the assembled state of the device 100 shown, the touch protection cover 16 is connected to the carrier plate 14 and the switching device 30 is arranged correspondingly below the touch protection cover 16.

The device 100 is characterised, among other things, by the fact that the second detachable connection 26 is arranged in such a way that it is not accessible when the device 100 is mounted. For this purpose, the second releasable connection 26 may be arranged, for example, in the portion of a gap 28 between an outer face of the touch protection cover 16 and an inner face of the housing 12. This gap 28 may be configured in such a way that a user cannot loosen or close the second detachable connection 26 manually or using conventional tools. For example, the gap 28 may comprise a width of less than 2 cm or 1 cm or may be configured such that the second detachable connection 26 rests against the inner surface of the housing 12. Alternatively or additionally, the second detachable connection 26 may be arranged on a side of the carrier plate 14 facing away from the touch protection cover 16.

The second detachable connection 26 may comprise at least one clip, snap, screw and/or latch connection. In the embodiment example shown, the second detachable connection comprises several lateral clip connections between the touch protection cover 16 and the carrier plate 14, which are arranged in the portion of the gap 28 in the assembled state, and also screw connections between the touch protection cover 16 and the carrier plate 14, which are only accessible from the underside of the battery junction box assembly 10, i.e. from the side of the carrier plate.

The first terminal 18 may comprise a plurality of electrical cables 18, each electrically and mechanically connected at one end to the switching device 30, and each comprising an insulated connector 24 at the other end. The electrical cables 18 and the insulated connectors 24 may be passable or routed through apertures 48 of the housing 12, preferably wherein lengths of the plurality of electrical cables 18 are dimensioned such that, when the device 100 is assembled, each of the apertures 48 is occupied by one of the plurality of electrical cables 18.

The second terminal 20 may comprise a plug-in unit 40 configured in the housing 12, which is electrically connected to the switching device 30.

Furthermore, a control unit 50 for controlling the switching device 30 may be arranged on the carrier plate 14, wherein the control unit 50 is arranged outside the touch protection cover 16 when the device 100 is mounted. The control unit 50 may be connected to the switching device 30 in terms of signaling technology, wherein the switching device 30 comprises a sensor system for measuring a current conducted through the switching device 30 and at least one disconnecting element, preferably at least one contactor, for controllably establishing or disconnecting the electrical connection between the first terminal 18 and the second terminal 20. The control unit 50 is configured to control the at least one disconnecting element as a function of the measurement. During operation, the control unit may use predetermined conditions to independently decide at which current strength values and/or current voltage values measured by the sensor system the electrical connection between the first terminal and the second terminal is to be established and/or disconnected. If a measured current voltage value of the current that is conducted from the electric traction energy storage system via the switching device 30 to the high-voltage on-board electrical system is above a predetermined limit value, for example, the control unit 50 may instruct the at least one disconnecting element to disconnect the electrical connection established by the switching device 30 and to avoid possible damage to the electric traction energy storage system and/or the high-voltage on-board electrical system.

Figure 2:
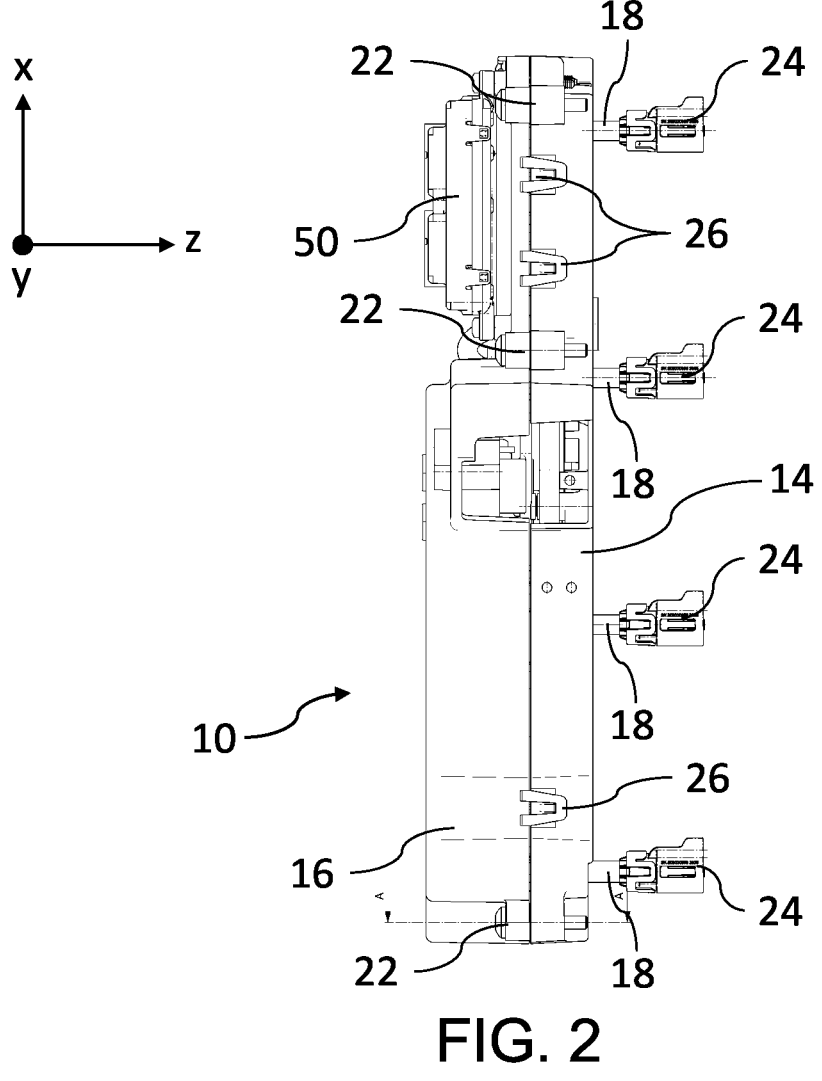
FIG. 2 shows a schematic side view of a battery junction box assembly according to one embodiment.

FIG. 2 shows a schematic side view of the battery junction box assembly 10 in an assembled state, i.e. the touch protection cover 16 is connected to the carrier plate 14 by means of the second detachable connection 26, which in this embodiment comprises a plurality of laterally arranged clip connectors.

Figure 3:
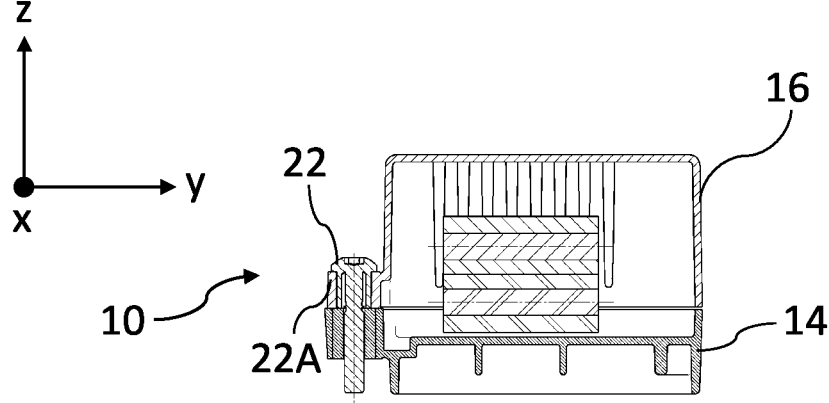
FIG. 3 shows a schematic sectional view of the battery junction box assembly according to one embodiment.

FIG. 3 schematically shows a sectional view of the battery junction box assembly 10, in which in particular a captive screw 22 of the second detachable connection 22 is shown. The screw 22 is inserted in a bushing 22A, which is integrated in the touch protection cover 16, wherein the respective bushing 22A is configured such that the screw 22 cannot be removed from the bushing.

Figure 4:
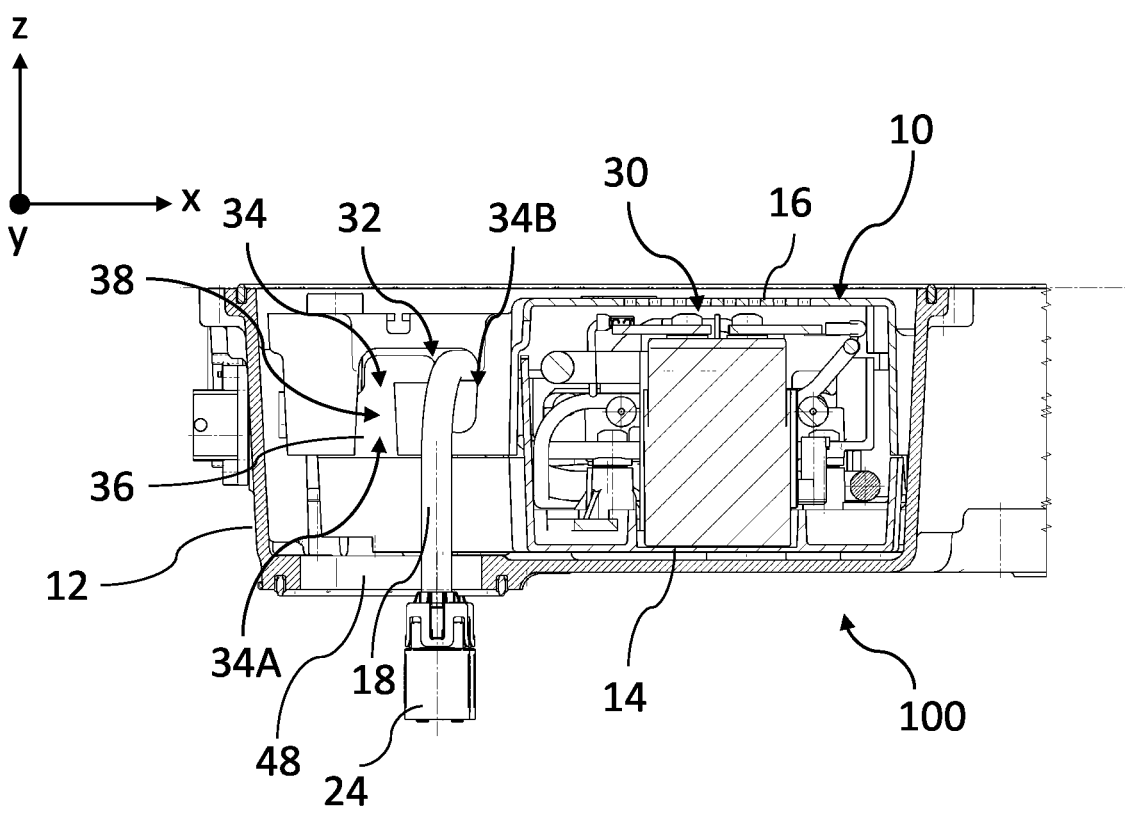
FIG. 4 shows a schematic sectional view of the device according to one embodiment.

As shown in FIG. 4, the electrical cables 18 of the first terminal 18 may each pass through one of a plurality of openings 32 formed by the touch protection cover 16 and/or the carrier plate 14. At least one of the plurality of openings 32 may comprise an adjacent holder 38 for one of the electrical cables 18 passed there through, which holder 38 is formed in a form-fitting manner by the touch protection cover 16 and the carrier plate 14 when the device 100 is mounted.

The holder 38 may be configured by a curved, for example U-shaped or semi-circular, recess 34 in the touch protection cover 16 and a projection 36 of the carrier plate. The recess 34 may comprise an open end 34A for insertion of the at least one electrical cable 18 and a closed end 34B. When the device 100 is assembled, the recess 34 and the protrusion 38 may engage positively with each other so that one of the electrical cables 18 is threaded and retained in the closed end 34B of the recess 34. The holder 38 may also be referred to as a labyrinth.

Further, as shown in FIG. 4, the length of the at least one electrical cable 18 may be dimensioned such that the at least one electrical cable 18 is passed through the aperture 48 of the housing 12 when the device 100 is assembled and the insulated connector 24 of the at least one electrical cable 18 is arranged completely outside the housing 12. Furthermore, the length of the electrical cables 18 is to be such that when the battery junction box assembly 10 is removed from the housing 12, the cables would stretch after a short time and the electrical cables 18 would have to be disconnected at the connectors 24 in order to completely remove the battery junction box assembly 10. This ensures that the supply voltage is automatically disconnected during removal.

Figure 5:
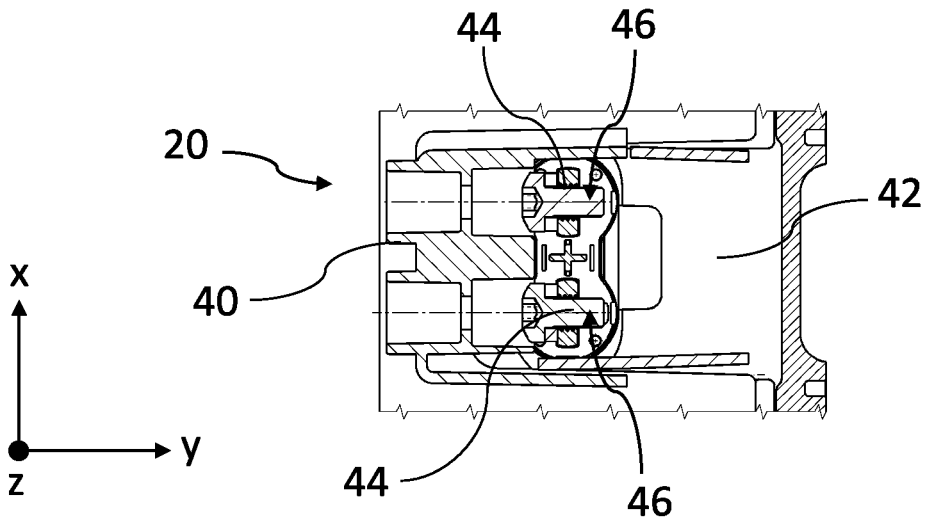
FIG. 5 shows a schematic section of a top view of the device according to one embodiment.

FIG. 5 schematically shows the second terminal 20, which comprises the plug-in unit 40 configured in the housing 12 and at least one electrical line 42, preferably at least one busbar, for establishing an electrical connection between the plug-in unit 40 and the switching device 30. In the assembled state of the battery junction box assembly 10 shown, the at least one electrical line 42 is covered by the touch protection cover 16.

At least one contact screw 44 may be provided, with which the at least one electrical cable 42 is screwed or may be screwed to a contact of the plug-in unit 40. The at least one contact screw 44 may be held captive in a receiving opening of the at least one electrical cable 42 by the touch protection cover 16. For this purpose, an anti-loss device 46 may be configured in the touch protection cover 16 in such a way that the at least one contact screw 44 is prevented from falling out of the receiving opening and preferably at least one opening is provided through which at least one contact screw 44 may be screwed to the contact of the plug-in unit 40 using conventional tools.

FIG. 6 schematically illustrates the method for assembling the device 100 for establishing an electrical connection between an electrical traction energy storage system and a high-voltage on-board electrical system of a motor vehicle.

In step S1 of the method 100, the battery junction box assembly 10 is assembled by connecting the carrier plate 14 to the touch protection cover 16 by means of the second releasable connection 26.

In steps S2 and S3 of the method 100, the assembled battery junction box assembly 10 is inserted into the housing 12 and connected to the housing 12 by means of the first releasable connection 22.

In step S4 of the method 100, the electric traction energy storage system is connected to the first terminal 18 of the device 100 and the high-voltage on-board electrical system is connected to the second terminal 20 of the device 100. This establishes the electrical connection between the traction energy storage system and the high-voltage on-board electrical system.

As the procedure is only possible in this sequence and thus an electrical connection of the device 100 to the electric traction energy storage system and the high-voltage on-board electrical system of the motor vehicle is only established when the device 100 is in the assembled state, the battery junction box assembly 10 is permanently protected against contact during the entire assembly and in the assembled state.

However, even when the device 100 is dismantled, it is ensured that the battery junction box assembly 10 is permanently protected against contact. It is not possible to remove the touch protection cover 16 from the carrier plate 14 and reach "bare" live parts of the switching device 30, the first terminal 18 or the second terminal 20 as long as the traction energy storage system and the high-voltage on-board electrical system are still electrically connected to the battery junction box assembly 10. Instead, the electric traction energy storage system is disconnected from the first terminal 18 and the high-voltage on-board electrical system is disconnected from the second terminal 20, thereby "de-energising" the battery junction box assembly 10. The battery junction box assembly 10 is then unscrewed from the housing 12, i.e. the first detachable connection 22 is released and the battery junction box assembly 10 is removed from the housing 12.

If an attempt is made to remove the battery junction box assembly 10 from the housing 12 without disconnecting the electrical connectors to the electrical traction energy storage system, the selected lengths of the multiple electrical cables 18 and optionally also the at least one holder 38 may cause the electrical connections to the traction energy storage system to be disconnected by a respective tensile force on the multiple cables 18. For example, the plug connectors 24 may thus be disconnected from their respective counterparts of the traction energy storage system.

If the battery junction box assembly 10 is then located at the user's workplace, for example, the second detachable connection 26 may be released and the touch protection cover 16 may be removed. The battery junction box assembly 10 is thus permanently protected against contact when electrical voltage is present, i.e. when it is connected to the traction energy storage device.

The invention is not limited to the preferred embodiments described above. Rather, a large number of variants and modifications are possible which also make use of the inventive concept and therefore fall within the scope of protection. In particular, the invention also claims protection for the subject matter and the features of the dependent claims independently of the claims referred to. In particular, the individual features of independent claim 1 are each disclosed independently of one another. In addition, the features of the sub-claims are also disclosed independently of all the features of independent claim 1.

LIST OF REFERENCE SYMBOLS

10 Battery junction box assembly
12 Housing
14 Carrier plate
16 Touch protection cover
18 First terminal, electrical cables
20 Second terminal
22 First detachable connection, screw
22 Socket
24 Connector
26 Second detachable connection
28 Gap
30 Switching device
32 Opening
34 Recess
34A, 34B Opened or closed end of the recess
36 Lead
38 Holder
40 Plug-in unit
42 Electrical cable
44 Contact screw
46 Loss protection
48 Breakthrough
50 Control unit
100 Device
S1, S2, S3, S4 Process steps

The invention claimed is:

1. An apparatus for establishing an electrical connection between an electrical traction energy storage system and a high-voltage on-board electrical system for a motor vehicle, comprising:
a housing; and
a battery junction box assembly which is connected or connectable to the housing by means of a first detachable connection, the battery junction box assembly including a switching device and a touch protection cover, the switching device is arranged on a carrier plate and configured to selectively establish or disconnect an electrical connection between a first terminal for connecting the electrical traction energy storage system and a second terminal for connecting the high-voltage on-board electrical system, the touch protection cover configured as a cover for the switching device and connected or connectable to the carrier plate using a second detachable connection, wherein the second detachable connection is arranged in such a way that it is not accessible in an assembled state of the device.

2. The apparatus according to claim 1, wherein the housing is made of metal and the touch protection cover is made of plastic.

3. The apparatus according to claim 1, wherein in a mounted state of the apparatus, the second detachable connection is arranged in or on at least one of: a portion of a gap between an outer face of the touch protection cover and an inner face of the housing; and a side of the carrier plate facing away from the touch protection cover.

4. The apparatus according to claim 3, wherein the gap comprises a width smaller than 2 cm or is configured such that the second detachable connection abuts against the inner surface of the housing.

5. The apparatus according to claim 1, wherein the second detachable connection comprises at least one of a clip, a snap, a screw and a latch connection.

6. The apparatus according to claim 1, wherein the first detachable connection comprises at least one screw which is inserted into the touch protection cover in a captive manner.

7. The apparatus according to claim 1, wherein the first terminal comprises a plurality of electrical cables connected to the switching device and passing through a plurality of openings formed by at least one of the group consisting of: the touch protection cover; and the carrier plate.

8. The apparatus according to claim 7, wherein at least one of the plurality of openings comprises an adjacent holder for one of the plurality of electrical cables, the adjacent holder formed in a form-fitting manner by the touch protection cover and the carrier plate in the mounted state of the apparatus.

9. The apparatus according to claim 8, wherein each of the plurality of electrical cables comprises an insulated plug connector and is configured to pass through or passes through at least one breakthrough opening of the housing.

10. The apparatus of claim 9, wherein lengths of the plurality of electrical cables are dimensioned such that, in the assembled state of the apparatus, each of the at least one breakthrough openings is occupied by one of the plurality of electrical cables.

11. The apparatus according to claim 7, wherein each of the plurality of electrical cables comprises an insulated plug connector and is configured to pass through or passes through at least one breakthrough opening of the housing.

12. The apparatus according to claim 1, wherein the second terminal comprises a plug-in unit configured in the housing and at least one electrical line for establishing an electrical connection between the plug-in unit and the switching device.

13. The apparatus according to claim 12, wherein the at least one electrical line is covered by the touch protection cover in the mounted state of the apparatus.

14. The apparatus according to claim 13, wherein at least one contact screw, with which the at least one electrical line is screwed or may be screwed to a contact of the plug-in unit, is held in a captive manner by the touch protection cover in a receiving opening of the at least one electrical line.

15. The apparatus according to claim 1, wherein a control unit configured to control the switching device is further arranged on the carrier plate.

16. The apparatus according to claim 15, wherein the switching device comprises a sensor system configured to measure a current conducted through the switching device and at least one disconnecting element, for controllably establishing or disconnecting the electrical connection between the first terminal and the second terminal, and the control unit is configured to control the at least one disconnecting element as a function of the measurement.

17. A method for assembling a device for establishing an electrical connection between an electrical traction energy storage system and a high-voltage on-board electrical system of a motor vehicle, comprising:
assembling a battery junction box assembly by connecting a carrier plate to a touch protection cover, which is configured as a cover for a switching device arranged on the carrier plate, using a second detachable connection, the second detachable connection being arranged in such a way that it is not accessible in an assembled state of the device;

inserting the battery junction box assembly into a housing;

connecting the battery junction box assembly to the housing using a first detachable connection; and connecting the electrical traction energy storage system to a first terminal of the device and the high-voltage on-board electrical system to a second terminal of the device.

18. A motor vehicle, comprising an apparatus according to claim 1, wherein the electrical traction energy storage system is connected to the first terminal of the device and the high-voltage on-board power supply is connected to the second terminal of the device.

\* \* \* \* \*